United States Patent [19]

Lowenschuss

[11] 4,223,404
[45] Sep. 16, 1980

[54] APPARATUS FOR RECYCLING COMPLETE CYCLES OF A STORED PERIODIC SIGNAL

[75] Inventor: Oscar Lowenschuss, Goleta, Calif.

[73] Assignee: Raytheon Company, Lexington, Mass.

[21] Appl. No.: 900,224

[22] Filed: Apr. 26, 1978

[51] Int. Cl.$^2$ .................... H04B 15/00; H03K 4/00
[52] U.S. Cl. .................................. 375/94; 375/3; 455/18; 307/354; 364/900
[58] Field of Search ............ 325/6, 21, 321-325, 325/13; 179/15.55 T; 340/347 SH; 235/92 FQ, 92 TF, 92 SH; 328/162, 165, 15; 324/186, 187, 78 D, 83 D, 83 Q; 307/354; 364/900 MS File; 360/32; 178/88

[56] References Cited

U.S. PATENT DOCUMENTS

| 3,093,796 | 6/1963 | Westerfield | 179/15.55 T |
| 3,321,710 | 5/1967 | Dunnican | 179/15.55 T |
| 3,643,220 | 2/1972 | Katagi | 364/900 |
| 3,757,051 | 9/1973 | Girard et al. | 325/13 |
| 3,789,137 | 1/1974 | Newell | 179/15.55 T |
| 3,803,363 | 4/1974 | Lee | 179/15.55 T |
| 3,872,503 | 3/1975 | Shuttery | 179/15.55 T |
| 3,975,763 | 8/1976 | Kitamura | 179/15.55 T |
| 4,091,242 | 5/1978 | Carrubba et al. | 179/15.55 T |

Primary Examiner—Gareth D. Shaw
Assistant Examiner—E. Chan
Attorney, Agent, or Firm—Richard M. Sharkansky; Joseph D. Pannone

[57] ABSTRACT

A memory system adapted to receive a radio frequency signal and produce a signal having a frequency related to the frequency of the received signal for an extended, predetermined period of time. The received signal is heterodyned to an intermediate frequency signal. The intermediate frequency signal is sampled and digitized by an analog-to-digital converter. One bit of each digitized sample has a logic state related to the polarity of the intermediate frequency signal. The bits associated with the samples are stored for a time interval beginning at a time the intermediate frequency signal changes polarity with a predetermined sense, i.e. the start of a complete cycle of the signal. A control signal is produced providing an indication of the portion of the bits stored in the shift register at the end of the time interval which is associated with complete cycles of the stored signal and the portion of the stored bits which is associated with an incomplete cycle of the stored signal. In response to the control signal only the portion of the stored data associated with complete cycles of the signal is recycled in the shift register. With such arrangement the recycled data, which is used to generate the signal having extended time duration, is produced with minimum phase discontinuity.

4 Claims, 12 Drawing Figures

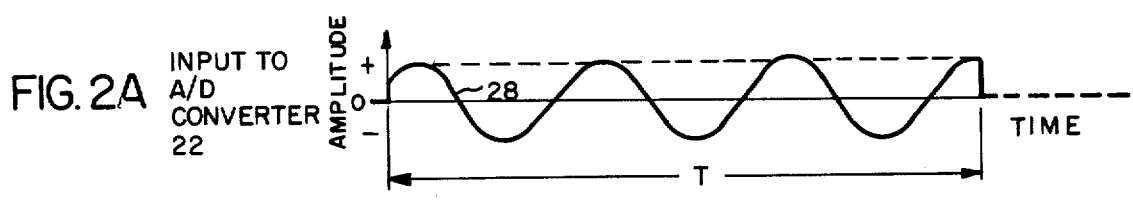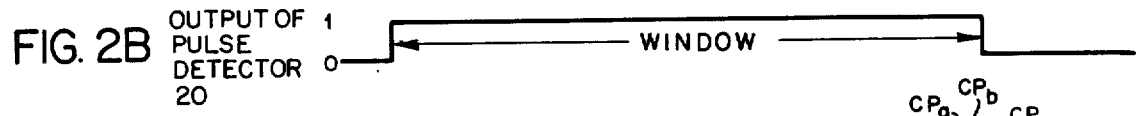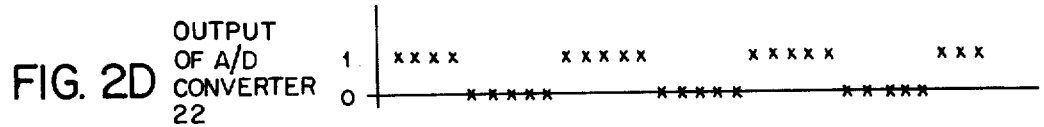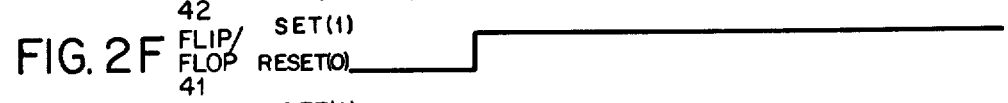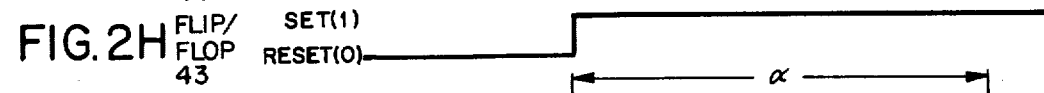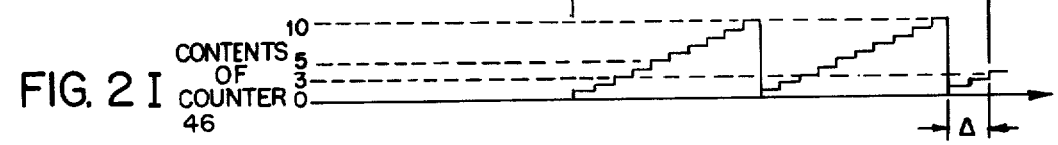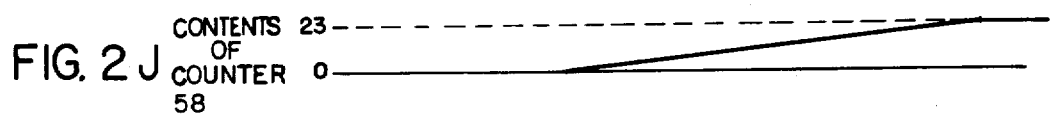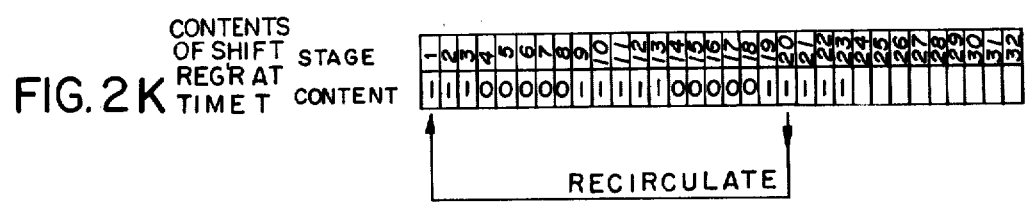

APPARATUS FOR RECYCLING COMPLETE CYCLES OF A STORED PERIODIC SIGNAL

BACKGROUND OF THE INVENTION

This invention relates generally to memory systems and more particularly to memory systems which are adapted to receive a radio frequency signal and produce a signal having a frequency related to the received radio frequency signal for an extended period of time.

As is known in the art, it is sometimes desirable to receive a pulse or "slice" of a received radio frequency signal and produce a continuous wave signal having a frequency related to the frequency of the received signal. Such continuous wave signal may, for example, be either transmitted as a continuous wave signal or pulse modulated to enable transmission of a train of radio frequency signals. One technique suggested to produce such continuous wave signal has been to store the received signal in a recirculating memory; however, because the phase of the received signal at the start of the pulse or "slice" relative to the phase of the signal at the end of the pulse or "slice" is generally not known because the frequency of the received signal is not known, a phase discontinuity may be produced during the recycling. This phase discontinuity distorts the continuous wave signal being produced and thereby reduces the effectiveness of the memory system.

SUMMARY OF THE INVENTION

With this background of the invention in mind it is therefore an object of this invention to provide an improved memory system adapted to receive a radio frequency signal and produce a signal having a frequency related to the frequency of the received signal for an extended period of time.

It is another object of the invention to provide an improved memory system adapted to store a finite time interval of a signal related to a received sinusoidal signal and recycle such stored signal in such memory system for an extended period of time with minimum phase discontinuity in the recycled signal.

These and other objects of the invention are attained generally by providing a memory system comprising: Means for storing a finite time interval, $\alpha$, of an input signal having an amplitude repeatedly passing through a predetermined level, storage of such signal commencing at a time related to a time the amplitude of the input signal passes through the predetermined level in a predetermined manner; means for producing a control signal representative of a time interval, $\Delta$, between a subsequent time such signal passes through the predetermined level in the predetermined manner and the finite time interval, $\alpha$; and, means, responsive to the control signal, for enabling a portion of the stored signal to recycle in the memory system, such portion being the finite time interval $\alpha$ adjusted by a time interval related to the time interval $\Delta$.

In a preferred embodiment of the invention the received signal is a pulse of radio frequency energy. The received signal is heterodyned to an intermediate frequency signal. The intermediate frequency signal is digitized in an analog-to-digital (A/D) converter, a bit having a logical state related to the polarity of the intermediate frequency signal. Consequently, a change in the logical state between successive bits indicates that the amplitude of the intermediate frequency signal changed polarity, that is, crossed a predetermined level, i.e. a level of zero.

A flip/flop is coupled to the output of the A/D converter and alternates between a set condition and a reset condition each time successive bits change logical state. Each change in logical state of the flip/flop therefore identifies a "zero" crossing of the intermediate frequency signal. Further, because a complete cycle of the intermediate frequency signal may be identified or defined when such signal successively crosses zero with the same slope, a complete cycle of such signal may be identified or defined when the flip/flop successively changes from a logical 0 state to a logical 1 state (or, alternatively, successively changes from a logical 1 state to a logical 0 state).

When the flip/flop identifies the commencement of the first cycle of the intermediate frequency signal (as when, for example, such flip/flop changes from a logical 0 state to a logical 1 state) a finite number of samples of the intermediate frequency signal is successively stored in a digital shift register. A first counter counts the number of samples, "a", stored in the shift register. Because the storage terminates at the end of the received pulse and because the frequency of the signal is unknown, the last few stored samples may not be associated with a complete cycle of the intermediate frequency signal. Hence, merely recycling all samples stored in the shift register may result in recycling samples representing a signal having a phase discontinuity because an incomplete cycle of the "signal" is recycled.

A second counter is provided which counts the number of samples passed to the shift register for storage, but such second counter, unlike the first counter, is reset, in response to the flip/flop, at the "start" of each cycle of the intermediate frequency signal, i.e. each time the flip/flop changes from a logical 0 state to a logical 1 state, for example. Therefore, at the termination of the storage of samples the second counter contains a count, "b", representative of the number of stored samples of the incomplete stored cycle of the intermediate frequency signal. Hence the number of stored samples associated which only complete cycles of the signal is "a"–"b". Means are provided to recycle only samples of complete cycles. In particular, a selector is coupled to the output of the stages of the shift register and a gating arrangement is coupled to the input of the shift register. After termination of the received pulse the selector responds to a signal representative of the difference between the counts of the first and second counters, i.e. a count "a"–"b", and selects the proper output stage of the shift register for coupling to the input of the shift register to enable only a portion of the samples to recycle in the shift register, such portion being only the samples of complete cycles of the intermediate frequency signal, i.e. the samples "a"–"b", while inhibiting from recycling the samples of the incomplete cycle of the intermediate frequency signal, i.e. the samples "b".

BRIEF DESCRIPTION OF THE DRAWINGS

The foregoing features of this invention, as well as the invention itself, may be more fully understood from the following detailed description read together with the accompanying drawings, in which:

FIGS. 2A–2K are diagrams useful in understanding the invention.

DESCRIPTION OF THE PREFERRED EMBODIMENT

Figure 1:
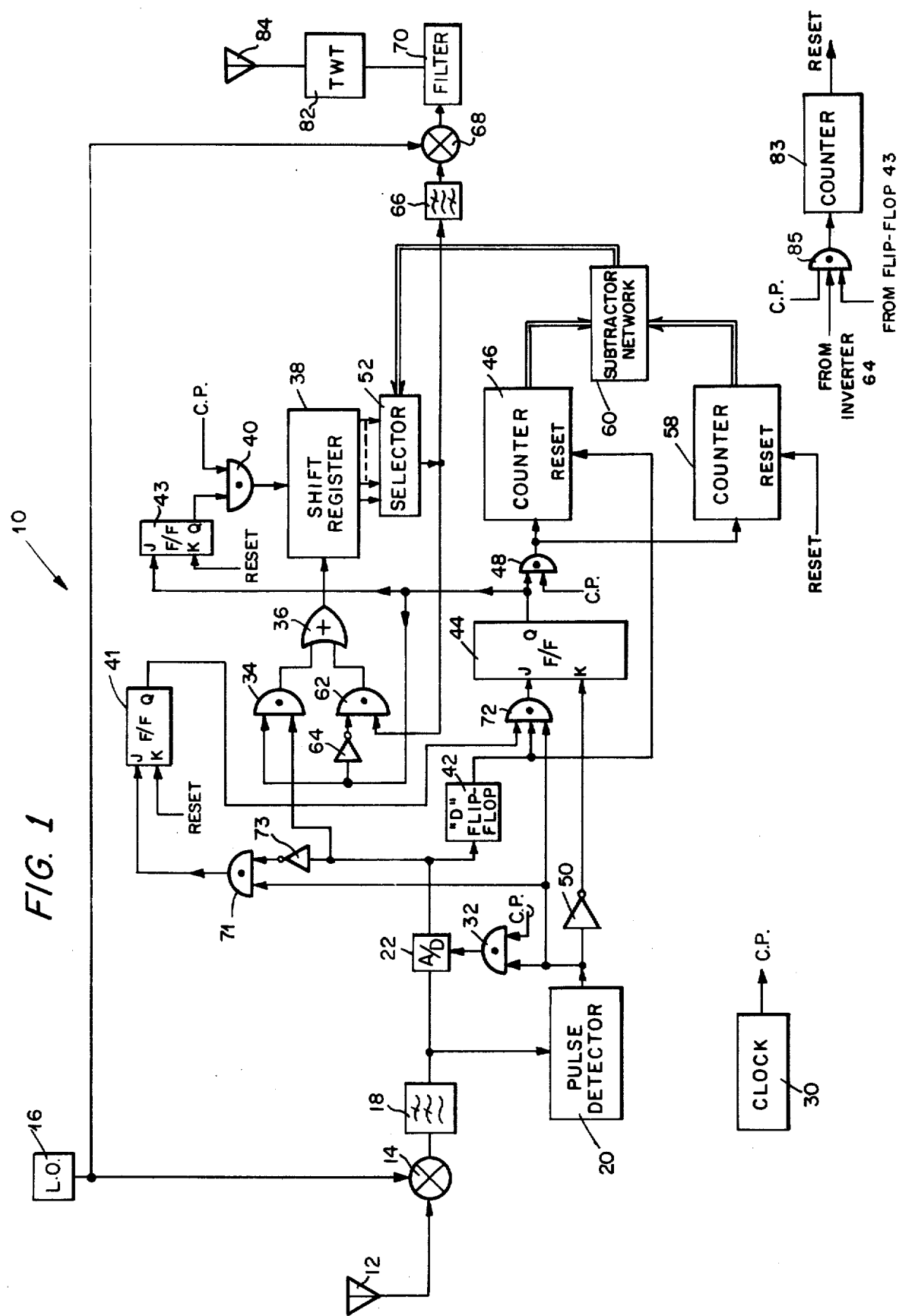
FIG. 1 is a block diagram of a memory system according to the invention.

Referring now to FIG. 1, a memory system 10 adapted to receive pulses of radio frequency energy and transmit a continuous radio frequency signal having a frequency related to the received radio frequency energy is shown. Such system includes a conventional radio frequency antenna 12 coupled to a mixer 14 as shown. Also fed to such mixer 14 is a local oscillator signal produced by a conventional local oscillator 16. The mixer heterodynes the local oscillator signal with the received radio frequency signal to translate the frequency of the received signal to a suitable intermediate frequency signal. Here, for example, the intermediate frequency is within the bandwidth 0 to 5 MHz. A low pass filter 18 is coupled to the output of the mixer 14 to reject harmonics having frequencies greater than 5 MHz which are produced by the heterodyning process described. Thus, the output of the low pass filter is an intermediate frequency signal having a frequency within the bandwidth 0 to 5 MHz.

The output of low pass filter 18 is coupled to a pulse detector 20 and an analog-to-digital (A/D) converter 22, as shown. Pulse detector 20 may be of any conventional design which detects the presence of radio frequency signal within the operating band of the memory system 10 and produces a high signal (i.e. logical 1) when such signal is detected and produces a low signal (i.e. logical 0) when such signal is not detected. Thus, referring also to FIGS. 2A and 2B, when a pulse of radio frequency energy within the intermediate frequency bandwidth is received the output of pulse detector 20 changes from a logical 0 to a logical 1 and when such pulse terminates (here a time interval T later) the output of pulse detector 20 changes from a logical 1 to a logical 0. It is noted in referring to FIG. 2A that the phase angle of the intermediate frequency signal 28 at the start of the received pulse is arbitrary and because the frequency of the radio frequency signal (and hence of the intermediate frequency signal) is unknown the phase angle of the intermediate frequency signal 28 at the end of such pulse is not known. Therefore, there is not generally an integral number of cycles of the intermediate frequency signal within the time interval T, here 3.2 μs.

Referring again to FIG. 1, a clock 30, here of any conventional design, produces clock pulses (cp) at a regular rate, here a rate slightly greater than 10 MHz, as shown in FIG. 2C. When a pulse is detected the output of pulse detector 20 goes "high" and enables such clock pulses (cp) to pass through AND gate 32 to A/D converter 22. In response to each clock pulse cp the A/D converter 22 produces here a one bit digital word representative of the amplitude of the intermediate frequency signal. Here a logical 1 is produced by the A/D converter 22 when the amplitude of such intermediate frequency signal is positive (i.e. greater than the zero level) at the time of a clock pulse cp and a logical 0 is produced when the amplitude of such signal is negative as shown in FIG. 2D.

A "D" type flip/flop 42, of any conventional design, is coupled to the output of A/D converter 22, as shown. The "D" type flip/flop 42 changes from one logical state to its other logical state each time the binary signal fed thereto changes. Here the "D" type flip/flop 42 changes from a reset condition to a set condition when the A/D converter 22 output produces a logical 1 and had previously produced a logical 0 and such "D" type flip/flop 42 changes from a set condition to a reset condition when the A/D converter 22 produces a logical 0 and had previously produced a logical 1 as shown in FIG. 2E. It is noted from FIG. 2E that the "D" type flip/flop 42 changes from a set condition to a reset condition in response to "negative" going "zero crossing" of the intermediate frequency signal 28 (FIG. 2A) and changes from a reset condition to a set condition in response to "positive" going "zero crossings" of the intermediate frequency signal 28 (except for the change at the commencement of the pulse (FIG. 2A). A complete cycle of the intermediate frequency signal is identified or defined when such signal successively crosses zero with the same slope, here a positive slope, and hence a complete cycle of such signal is detected when flip/flop 42 successively changes from, here, a logical 0 state to a logical 1 state after an initialization process, to be described. Suffice it to say here that such initialization process accounts for the fact that the initial phase and polarity of the intermediate frequency signal is unknown.

The output of the "D" type flip/flop 42 is fed to the set terminal (J) of a conventional J-K flip/flop 44 through an AND gate 72 and to the reset terminal of a conventional counter 46, as shown. Also coupled to AND gate 72 is the output of pulse detector 20 and the output of J-K flip/flop 41, as shown. The output of the pulse detector 20 is coupled to the J (set) terminal of a flip/flop 41 through AND gate 71, as shown. Also coupled to AND gate 71 is the output of A/D converter 22 through inverter 73, as shown. It follows then that the J-K flip/flop 41 (which is initially in a reset condition, by any convenient means, not shown) is placed in a set condition (producing a high signal at output Q) in response to the first logical 0 produced by A/D converter 22 after a pulse is detected. This is the initialization process and because of AND gate 72 ensures that the J-K flip/flop 44 is not placed in a set condition until the intermediate frequency signal passes through zero with a positive state regardless of the initial phase or polarity of such signal at the start of the received pulse. That is, subsequent to such initialization process, when the "D" type flip/flop 42 first changes from the reset condition to the set condition after flip/flop 41 has been set (i.e. at the start of a "cycle") the output of AND gate 72 goes high and the J-K flip/flop 44 changes from its initially reset condition to a set condition so that a high signal (i.e. logical 1) is produced at the output of such J-K flip/flop 44 (i.e. at terminal Q). The K (reset) terminal of flip/flop 44 is coupled to the output of pulse detector 22 through an inverter 50, as shown, and hence flip/flop 44 returns to its reset condition on termination of the received pulse, as shown in FIG. 2G. That is, the flip/flop 44 is in a set condition from the first cycle of the intermediate frequency signal to the termination of the pulse, i.e. a time interval α. While in such set condition the high signal at the output Q of the J-K flip-flop 44 (i.e. from the start of the first cycle to the termination of the pulse) enables samples produced by A/D converter 22 to pass through AND gate 34 and OR gate 36 to shift register 38, as shown. Such shift register 38 is of any conventional design, having a series of storage stages, the number of stages here being related to the longest expected radio frequency pulse. Here such shift register 38 includes 32 stages (i.e. stages 1 to 32). When the J-K flip/flop 44 is placed in a set condition a J-K flip/flop 43 is also placed in a set condition producing a high (or logical 1) at the output thereof, as shown in FIG. 2H. Clock pulses are fed to the shift register 38 through AND gate 40 when flip/flop 43 is in a set condition and hence samples produced by the A/D converter at the start of the first cycle become stored and shifted through the shift register 38. At the termination of the received pulse a high signal is produced by inverter 50 to reset flip/flop 44. When flip/flop 44 is reset no further samples produced by A/D converter 22 are enabled to pass through AND gate 34 and OR gate 36 to shift register 38. (It is noted, however, for reasons to become apparent, that after termination of the received pulse flip/flop 43 remains in a set condition as clock pulses continue to pass to shift register 38 through AND gate 40.) Referring to FIG. 2G it follows then that 23 samples become stored in the shift register 38 (i.e. samples taken for a period of time $\alpha$, from the start of the first cycle as detected by "D" flip/flop 42, after an initialization process, to the termination of the received pulse). Here 23 samples of the intermediate frequency signal become stored in stages 1 to 23 of the shift register 38 at time T as shown in FIG. 2K. The high signal at terminal Q of flip/flop 44 enables clock pulses cp from clock 30 to pass through AND gate 48 to counter 46, as shown. It is noted, however, that counter 46 is reset each time the "D" type of flip/flop 42 output does from a set condition to a reset condition (at the start of each new cycle of the intermediate frequency signal) as shown in FIG. 2I. It is also noted that when the output of pulse detector 20 goes low a high signal is produced at the output of inverter 50 (FIG. 1) which resets the J-K flip/flop 44 (as shown in FIG. 2G) providing a low signal at terminal Q thereof to inhibit further counting by the counter 46. It follows then that the counter 46 is reset each time a complete cycle of the digitized intermediate frequency signal is stored in the shift register 38 and the count stored in the counter 46 at the end of the pulse (a time interval T) represents that portion of an incomplete cycle which has been stored in the shift register 38. That is, referring to FIG. 2I, at the time T the counter 46 stores a count $\Delta$, here a count of three, because three clock pulses $cp_a$, $cp_b$, $cp_c$ have occurred since the last resetting of counter 46 (see FIGS. 2C and 2I). It follows then, referring to FIG. 2D, that if the data recycled in the shift register 38 is shortened by three bits an integral number of cycles, here two cycles, of data would recycle through such shift register 38. That is, referring also to FIG. 2K, if the data stored in stages 1 through 20 (rather than the data stored in the entire register 38 at time T), is recycled in the shift register 38 exactly two cycles of the digitized intermediate frequency signal would recycle through such shift register 38.

Referring now also to FIG. 1, a selector 52 is coupled to the output of at least half of the last stages of the shift register 38. Here such selector is coupled to the output of stages 15 through 32. The output of AND gate 48 is also coupled to a counter 58, as shown. It is noted the counters 46 and 58 are counting the same clock pulses fed through AND gate 48 except that counter 46 is reset of the "D" type flip/flop 42 and the counter 58 is not reset by such "D" type flip/flop 42. It follows then that the counter 58 will contain the number of clock pulses passed to the shift register 38 after flip/flop 44 is placed in a set condition and therefore the contents of such counter 58 will provide an indication of the number of stages which store bits produced by A/D converter 22 (i.e. the number of stored samples). Here such counter 58 stores a count of 23 at the time T as indicated in FIG. 2J because 23 samples are stored during the time interval $\alpha$. The outputs of counters 46, 58 are fed to a digital subtractor network 60 which produces a digital word representative of the difference between the contents of counter 58 (i.e. a count representative of $\alpha$) and the contents of counter 46 (a count representative of $\Delta$) here 23 minus 3 or a digital word representative of 20. This digital word represents the stage of the shift register 38 which is to be coupled to the output of selector 52. Here the digital word produced by subtractor network 60, i.e. $(20)_{10}$, couples stage 20 to the output of selector 52. The output of selector 52 is fed, inter alia, to an AND gate 62. Also fed to such AND gate 62 is the output of J-K flip/flop 44 after passing through an inverter 64 as shown in FIG. 1. It follows then that at the termination of the pulse, because the flip/flop 44 is placed in a reset condition, the output of selector 52 becomes coupled to the input of the shift register 38 (via AND gate 62 and OR gate 36) and the output of AND gate 34 is inhibited from passing samples to OR gate 36 at the end of the received pulse (at time T). Further clock pulses continue to pass through AND gate 40 after the termination of such pulse because flip/flop 43 (FIG. 2H) is still in a set condition as discussed above. It follows then that the digital bits stored in stages 1 through 20 recirculate in the shift register and appear sequentially at the output of selector 52.

The output of selector 52 is also fed to a bandpass filter 66 (FIG. 1) to filter harmonics of the binary signals passed thereto from selector 52. The fundamental frequency of such binary signals will be the frequency of the intermediate frequency signal fed to the A/D converter. This fundamental frequency signal is fed to a mixer 68 where it is heterodyned with the local oscillator signal produced by local oscillator 16 to upconvert such fundamental frequency signal to a continuous wave signal having the frequency of the received radio frequency pulse. It is noted that because the binary signals have an integral number of cycles the fundamental frequency signal and here the continuous wave signal will not have any phase discontinuity. The output of the mixer 68, after passing through a filter 70 to remove higher order harmonics, is amplified in a conventional radio frequency amplifier, here a traveling wave tube (TWT) amplifier 82 and transmitted via antenna 84. After a desired number of cycles of the continuous wave signal have been transmitted the recycling of the shift register 38 is stopped by resetting flip/flop 41, 43 and counter 58 via a signal on line RESET (FIG. 1) by any convenient means, as an operator. Alternatively, the output of inverter 64 (which goes high after termination of the pulse and during recycle) (i.e. when flip/flop 43 is high) is used to enable clock pulses to pass through AND gate 85 to counter 83. When a predetermined number of pulses have been counted a reset signal is produced on line RESET.

Having described a preferred embodiment of this invention, it is evident that other embodiments incorporating these concepts may be used. For example, while here the data in the shift register is recycled by coupling a selected output stage to the input, alternatively the output may be coupled into a selected one of the stages as an input to the shift register. Further, while a binary shift register has been described as the recycling mechanism, a recirculating fiber-optic or surface-acoustic wave delay line may be used. Further, the sample may be represented by more than one bit digital words. it is felt, therefore, that this invention should not be restricted to the disclosed embodiment, but rather should be limited only by the spirit and scope of the appended claims.

What is claimed is:

1. Apparatus for storing a periodic input signal and for recycling complete cycles of such periodic input signal comprising:
   (a) means for storing a first finite time interval, $\alpha$, of the periodic input signal having an amplitude repeatedly passing through a predetermined level, said finite time interval commencing at a time related to a time the periodic input signal passes through the predetermined level in a predetermined manner;
   (b) means, responsive to the periodic input signal passing through the predetermined level in the predetermined manner, for producing a signal representative of a second finite time interval, $\Delta$, such second finite time interval being between a subsequent time said periodic input signal passes through the predetermined level in the predetermined manner and the time of termination of the first finite time interval, $\alpha$, and,
   (c) means, responsive to the signal representative of the second finite time interval, $\Delta$, for enabling a portion of the stored periods input signal to recycle in the apparatus, said portion being related to the first finite time interval, $\alpha$, adjusted by a time interval related to the second finite time interval, $\Delta$.

2. Apparatus for storing a periodic input signal and for recycling complete cycles of such periodic input signal, comprising:
   (a) means for digitizing the periodic input signal for a first finite time interval, $\alpha$, by producing a series of one bit digital words, each word being representative of the polarity of the periodic input signal, said first finite time interval commencing at a time related to the time said periodic input signal changes polarity in a predetermined manner;
   (b) shift register means for storing the digital words;
   (c) means, responsive to the periodic input signal changing polarity in the predetermined manner, for producing a signal representative of a second finite time interval $\Delta$ between a subsequent time the periodic input signal changes polarity in the predetermined manner and the time of termination of the first finite time interval, $\alpha$; and
   (d) means, responsive to the signal representative of the second finite time interval, $\Delta$, for enabling a portion of the stored digital words to recycle in the shift register means, such portion having a time interval equal to the first finite time interval $\alpha$ adjusted by a time interval related to the second finite time interval $\Delta$.

3. Apparatus for storing a periodic input signal and for recycling complete cycles of such periodic input signal, comprising:
   (a) means for producing control signals at times related to the times the periodic input signal with an amplitude cyclically passing through a predetermined level passes through such level with a predetermined slope, such control signals indicating the start of each cycle of the periodic input signal;
   (b) storage means;
   (c) means for commencing storage of said periodic input signal in the storage means in response to a first one of such control signals; and
   (d) means, responsive to the control signals for producing a signal representative of a time interval, $\Delta$, between a subsequent time a subsequent one of the control, signals is produced and a time of termination of the periodic input signal storage;
   (e) means, responsive to the signal representative of the time interval, $\Delta$, for enabling complete cycles of the stored periodic signal to recycle through the apparatus and for inhibiting incomplete cycles of such stored periodic input signal to recycle through the apparatus.

4. Apparatus for storing a periodic input signal and for recycling complete cycles of such periodic input signal, comprising:
   (a) means for producing control signals at times related to the times the periodic input signal with an amplitude cyclically passing through a predetermined level passes through such level with a predetermined slope, each control signal indicating the start of a cycle of the periodic input signal;
   (b) storage means;
   (c) means for commencing storage of said periodic input signal in the storage means in response to a first one of such control signals;
   (d) means responsive to the control signals for producing a signal representative of a time interval $\Delta$ of an incomplete cycle portion of the stored periodic input signal; and
   (e) means, responsive to the signal representative of the time interval $\Delta$ of an incomplete cycle portion of the stored periodic signal for recycling the complete cycle portion of the stored signal and for inhibiting recycling of the incomplete cycle portion of the stored signal.

* * * * *